(12) United States Patent
Schmidt

(10) Patent No.: US 10,132,560 B2
(45) Date of Patent: Nov. 20, 2018

(54) DEVICE AND METHOD FOR COOLING A UNIT

(75) Inventor: Heinz Schmidt, Möhrendorf (DE)

(73) Assignee: Siemens Aktiengesellschaft, München (DE)

( * ) Notice: Subject to any disclaimer, the term of this patent is extended or adjusted under 35 U.S.C. 154(b) by 421 days.

(21) Appl. No.: 14/343,656

(22) PCT Filed: Aug. 14, 2012

(86) PCT No.: PCT/EP2012/065893
§ 371 (c)(1),
(2), (4) Date: Mar. 7, 2014

(87) PCT Pub. No.: WO2013/034408
PCT Pub. Date: Mar. 14, 2013

(65) Prior Publication Data
US 2014/0221214 A1    Aug. 7, 2014

(30) Foreign Application Priority Data

Sep. 8, 2011 (DE) .................. 10 2011 082 352

(51) Int. Cl.
| F25D 31/00 | (2006.01) |
| F25D 19/00 | (2006.01) |
| H01F 6/04 | (2006.01) |
| F28D 15/02 | (2006.01) |
| G01R 33/38 | (2006.01) |
| F25B 23/00 | (2006.01) |

(52) U.S. Cl.
CPC ......... *F25D 31/005* (2013.01); *F25D 19/006* (2013.01); *F28D 15/0266* (2013.01); *F28D 15/0275* (2013.01); *H01F 6/04* (2013.01); *F25B 23/006* (2013.01); *G01R 33/3804* (2013.01)

(58) Field of Classification Search
CPC ... H01F 6/04; F28D 15/02; F25B 9/10; F25D 31/005
USPC .............................. 165/272, 104.21; 505/163
See application file for complete search history.

(56) References Cited

U.S. PATENT DOCUMENTS

| 3,637,007 A * | 1/1972 | Shlosinger ............. F28D 15/06 136/202 |
| 4,366,526 A * | 12/1982 | Lijoi .................. H05K 7/20672 174/15.2 |
| 5,285,347 A * | 2/1994 | Fox .......................... G06F 1/20 165/80.3 |
| 5,684,674 A * | 11/1997 | Yin ...................... H05K 7/1429 248/309.1 |
| 6,305,174 B1 * | 10/2001 | Binneberg ............... B64G 1/50 62/383 |
| 6,477,847 B1 | 11/2002 | Arman |

(Continued)

FOREIGN PATENT DOCUMENTS

| DE | 3621562 A1 | 1/1987 |
| DE | 10210524 C1 | 8/2003 |

(Continued)

*Primary Examiner* — Raheena R Malik
(74) *Attorney, Agent, or Firm* — Henry M. Feiereisen LLC

(57) ABSTRACT

The present invention relates to a method and a device (1) for cooling an arrangement (2) using a cold head (3), with a thermal cooling of the unit (2) to be cooled by means of the thermosiphon principle. At the same time, heat is conducted via a mechanical heat bridge (5), which provides a direct thermal connection from the cold head (3) to the unit (2) to be cooled.

12 Claims, 2 Drawing Sheets

(56) References Cited

U.S. PATENT DOCUMENTS

| | | | |
|---|---|---|---|
| 6,489,701 B1 | 12/2002 | Bushko | |
| 6,804,117 B2 * | 10/2004 | Phillips | F28D 15/0266 165/104.26 |
| 6,981,543 B2 * | 1/2006 | Chesser | F28D 15/043 165/104.13 |
| 7,207,178 B2 * | 4/2007 | Steinmeyer | F28D 15/0266 310/179 |
| 7,397,662 B2 * | 7/2008 | Oyamada | H05K 7/20572 165/80.4 |
| 7,692,926 B2 * | 4/2010 | Henderson | F28D 15/043 165/104.21 |
| 2003/0000721 A1 * | 1/2003 | Garner | H05K 7/20681 174/50 |
| 2004/0056541 A1 | 3/2004 | Steinmeyer | |
| 2006/0283199 A1 * | 12/2006 | Gwin | F28D 15/02 62/259.2 |
| 2008/0148756 A1 * | 6/2008 | Oomen | F25D 19/006 62/259.2 |
| 2009/0254227 A1 | 10/2009 | Tsuda | |
| 2009/0293504 A1 * | 12/2009 | Oomen | F25D 19/006 62/51.1 |
| 2010/0011753 A1 * | 1/2010 | Bidner | H01L 35/30 60/320 |
| 2010/0089073 A1 | 4/2010 | Pellegrino | |
| 2010/0155034 A1 * | 6/2010 | Muller | F28D 15/02 165/104.26 |
| 2010/0248968 A1 | 9/2010 | Stautner | |
| 2011/0133871 A1 | 6/2011 | Sivasubramaniam | |
| 2011/0271693 A1 * | 11/2011 | Jiang | F25D 19/006 62/47.1 |
| 2013/0165325 A1 * | 6/2013 | Frank | B63H 21/383 505/163 |

FOREIGN PATENT DOCUMENTS

| | | |
|---|---|---|
| DE | 102004061869 A1 | 7/2006 |
| DE | 102006046688 B3 | 1/2008 |
| EP | 0797059 A2 | 9/1997 |
| GB | 2461393 A | 1/2010 |
| GB | 2461893 A | 1/2010 |
| JP | 7142242 A | 6/1995 |

* cited by examiner

DEVICE AND METHOD FOR COOLING A UNIT

CROSS-REFERENCES TO RELATED APPLICATIONS

This application is the U.S. National Stage of International Application No. PCT/EP2012/065893, filed Aug. 14, 2012, which designated the United States and has been published as International Publication No. WO 2013/034408 and which claims the priority of German Patent Application, Serial No. 10 2011 082 352.2, filed Sep. 8, 2011, pursuant to 35 U.S.C. 119(a)-(d).

BACKGROUND OF THE INVENTION

The present invention relates to a method and a device for cooling a unit using a cold head, with a thermal cooling of the unit to be cooled by means of the thermosiphon principle.

Cold heads are frequently used to cool units, such as for instance superconducting coils, down to low temperatures. Superconducting coils can be used for instance in magnetic spin tomography devices, in motors, in generators or in current limiters. Cooling occurs here to temperatures of below 100 K. Particularly with the use of high-temperature superconducting (HTS)-materials, such as for instance $Y_2BaCu_3O_7$ (YBCO), superconducting properties of the conductor are already achieved at temperatures of liquid nitrogen.

Demands placed on the cooling system when cooling a unit are inter alia a short cooling-down time, a low temperature gradient within the unit to be cooled and/or a small temperature difference between the cold head and the unit to be cooled. The cooling of a unit with the aid of a cold head is described below. This is naturally similarly understood to mean the cooling of a number of units with a cold head, a unit with a number of cold heads or a number of units with a number of cold heads.

In order to cool a unit with a cold head, the unit to be cooled must be thermally connected to the cold head. There are different methods of thermally coupling the cold head to the unit to be cooled. Therefore the unit to be cooled can either be thermally coupled to the cold head with the aid of a heat bridge via heat conductance. Alternatively, the prior art discloses a thermal coupling of the unit to be cooled with the aid of a thermosiphon.

With the thermal coupling of the unit to be cooled with the aid of a heat bridge, the cold head is connected to the unit to be cooled by way of copper rails or copper bands. Since the cold head is connected via heat conductance with the unit to be cooled, the cold head is kept at a temperature T during the cooling-down process, which lies relatively just below the temperature $T_E$ of the unit. The temperature difference is dependent on the length and on the cross-section of the connection between the cold head and the unit to be cooled.

The cooling power P of a cold head reduces with the cold head temperature T. The minimal temperature difference between the cold head and the unit to be cooled causes the cold head always to operate at a high cooling power P within an optimal temperature range when cooling-down the system. The unit to be cooled can thus be cooled down relatively quickly.

Correspondingly large material cross-sections of the heat bridge are required to ensure that no large temperature gradients occur in the unit to be cooled and at the cold head in the cooled-down state. As a result, this can result in impermissibly high mechanical stresses on the sensitive cold head. Large temperature gradients in the cooled-down state in the unit to be cooled and at the cold head are to be prevented, since these result in a poor degree of efficiency during the cooling process.

During the thermal coupling of the unit to be cooled with the aid of a thermosiphon, a gaseous fluid, in particular neon, is condensed in a condenser. The condenser is to be connected to the cold head in an effective heat-conducting manner. The liquid fluid flows toward the unit to be cooled and can absorb heat there by transferring into the gaseous state. Since the condensation and evaporation of the fluid in the entire system almost takes place at the same temperature, only very small temperature gradients occur within the unit to be cooled and at the cold head. As a result the operating temperature of the cold head always lies at the boiling temperature of the cooling medium used.

Since the cold head also lies at a lower temperature T during the entire cooling-down period, it only supplies a relatively low cooling power P during this time. This causes the cooling-down of the object to be cooled to take a relatively long period of time.

SUMMARY OF THE INVENTION

The object of the present invention is therefore to specify a method and a device for cooling a unit, which have a high degree of efficiency when cooling the unit to be cooled and at the same time allow for a short cooling-down time.

According to one aspect of the invention, the object is achieved by a method for cooling a unit using a cold head with a thermal cooling of the unit to be cooled by means of the thermosiphon principle, wherein heat is conducted at the same time via a mechanical heat bridge, which provides a direct thermal connection from the cold head (3) to the unit (2) to be cooled.

According to another aspect of the invention, the object is achieved by a device for cooling a unit with a cold head, which is thermally connected to the unit to be cooled by means of the thermosiphon principle, wherein a mechanical heat bridge is provided, by way of which the cold head is directly thermally connected to the unit (2) to be cooled.

Advantageous embodiments of the inventive method for cooling a unit and the inventive device for cooling a unit are based on the respectively assigned dependent subclaims. The features of the subordinate claims can be combined here with one another and with features of the subclaims and features of the subclaims.

The inventive method for cooling a unit using a cold head includes a thermal cooling of the unit to be cooled by means of the thermosiphon principle. At the same time heat is conducted via a mechanical heat bridge, which directly thermally connects the cold head with the unit to be cooled.

As a result, a high degree of efficiency is achieved when cooling the unit to be cooled at the same time as a short cooling-down time. The connection via heat conductance keeps the cold head at a high temperature level when cooling down the system. When cooling down the system, the cold head thus provides a high cooling power P and operates with a relatively good degree of efficiency. The cooling power P available only reduces if the thermal capacitance Q of the object to be cooled also reduces. This achieves a short cooling-down time.

The thermosiphon takes over the cooling of the unit to be cooled when the cooling medium is at boiling temperature. The temperature difference between the unit to be cooled and the cold head becomes very small as a result, so that the cold head operates at an optimal cooling power P and degree of efficiency. A small temperature gradient can also be achieved in spatially extended objects by cooling with a boiling cooling medium.

A condenser can be in thermal contact with the cold head and gaseous fluid can be condensed at the condenser. The fluid can be transported in liquid form to the unit to be cooled and can pass into the gaseous state by absorbing a quantity of heat on or close to the unit to be cooled. A high degree of efficiency is achieved as a result with a small technical outlay.

Neon, helium or nitrogen can be used as fluid. In such cases the choice of fluid is dependent on the temperature $T_E$ of the unit to be cooled which is to be achieved and maintained. The fluid with its boiling point determines the temperature $T_E$, at which the unit to be cooled is held after cooling down. Nitrogen is thus suitable as fluid when using YBCO in a superconducting unit for maintaining the superconducting properties for instance.

The cold head can be kept at a temperature T greater than the boiling temperature of the fluid when cooling the unit to be cooled by way of the heat bridge and if the boiling temperature of the fluid is reached, then the cooling of the unit to be cooled essentially takes place by means of the thermosiphon principle. A short cooling-down time is achieved as a result during the cooling-down process and a high degree of efficiency is achieved when operating the unit to be cooled in the cooled state. In such a case the heat bridge can comprise a small cross-section.

A metal, in particular copper, can be used in particular as a mechanical heat bridge. Copper has high thermal conductivity and is thus well suited to ensuring a good heat transport between the cold head and the unit to be cooled.

A rail-shaped and/or band-shaped mechanical heat bridge can be used. These shapes have a large heat conductance cross-section with a low weight, low material consumption and high mechanical stability.

An inventive device for cooling a unit includes a cold head, which is thermally connected to the unit to be cooled by means of the thermosiphon principle. The device further comprises a mechanical heat bridge, by way of which the cold head is directly thermally connected to the unit to be cooled.

A condenser can be provided in thermal contact with the cold head so as to condense gaseous fluid on the condenser. A thermosiphon is provided for transporting the liquid fluid to the unit to be cooled and for transporting the gaseous fluid from the unit to be cooled to the condenser.

Neon, helium or nitrogen can be provided as fluid.

The cold head can be held at a temperature T of greater than the boiling temperature of the fluid when cooling down the unit to be cooled by way of the heat bridge. The cold head and the unit to be cooled can be kept essentially at the same temperature by way of the thermosiphon at a temperature $T_E$ of the unit to be cooled, which equates to the boiling temperature of the fluid.

With the inventive device, the mechanical heat bridge can be made of metal, in particular copper.

The mechanical heat bridge may be rail and/or band-shaped.

The mechanical heat bridge may be configured in multiple parts, in particular constructed from several individual rail and/or band-shaped heat bridges. An improved spatial distribution of the mass of the heat bridge can be achieved as a result. A greater heat conductance cross-section can also be achieved than when only one heat bridge is used. The heat bridge or bridges can be configured with a smaller cross-section than heat bridges in devices without a thermosiphon, since, from a temperature $T_E$ of the unit to be cooled equal to the temperature T of the cold head the cooling essentially takes place by means of the thermosiphon principle.

A number of thermosiphons can be provided for transporting the liquid fluid to the unit to be cooled and for transporting the gaseous fluid from the unit to be cooled to the condenser. As a result, improved heat transport can be achieved compared with the use of just one thermosiphon.

The unit to be cooled can include a superconductor, in particular in the form of at least one superconducting coil.

The advantages associated with the device for cooling a unit are similar to the advantages which were described above with reference to the method for cooling a unit.

BRIEF DESCRIPTION OF THE DRAWING

Preferred embodiments of the invention with advantageous developments according to the features of the dependent claims are explained in more detail below with reference to the Figures, though without being restricted thereto.

It is shown in the Figures in.

DETAILED DESCRIPTION OF PREFERRED EMBODIMENTS

Figure 1:
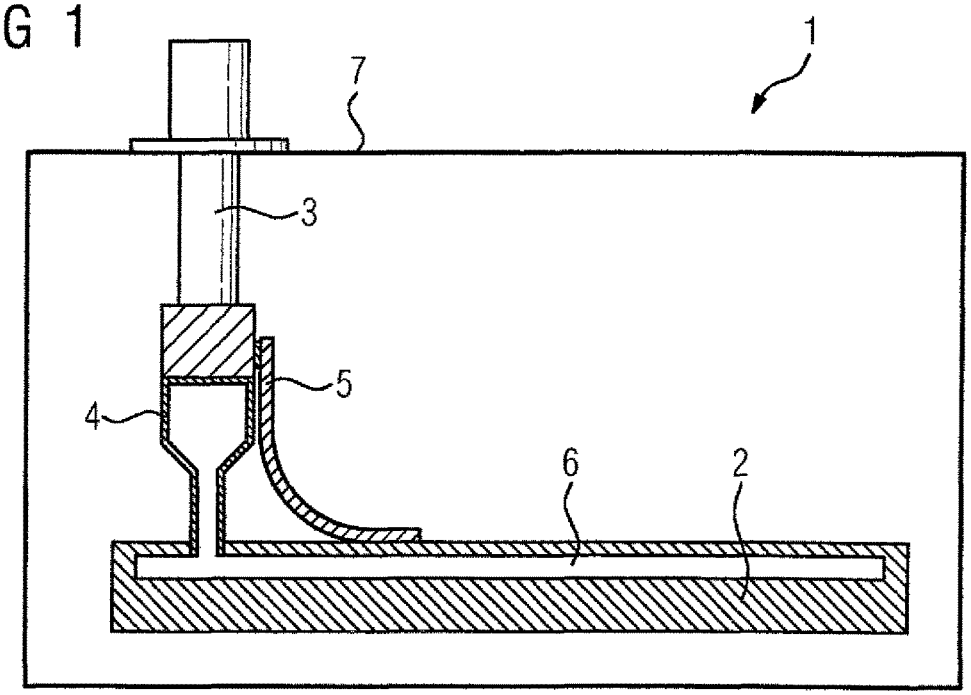
FIG. 1 a schematic sectional representation through an inventive device 1 for cooling a unit 2 to be cooled with a mechanical heat bridge 5 and a condenser with thermosiphon 4, and FIG. 2 a diagram of the cold head cooling power P as a function of the cold head temperature T, and FIG. 3 a diagram of the cooling power P as a function of the temperature $T_E$ of the unit 2 to be cooled, and FIG. 4 a diagram of the cold head temperature T as a function of the temperature $T_E$ of the unit 2 to be cooled.

FIG. 1 shows a schematic sectional representation through an inventive device 1 for cooling a unit 2 to be cooled. The device 1 includes a cold head 3, which is thermally connected to the thermosiphon 4 by way of a condenser and to the unit 2 to be cooled by way of a mechanical heat bridge 5. In the exemplary embodiment according to FIG. 1, only a cold head 3, a mechanical heat bridge 5 and a condenser with a thermosiphon 4 are shown in each case. However the invention also includes exemplary embodiments with a number of cold heads 3 and/or a number of mechanical heat bridges 5 and/or a number of condensers with thermosiphons 4, which are not shown in the Figures for the sake of simplicity.

In FIG. 1, the cold head 3 is directly thermally and mechanically connected to the condenser 4, wherein the condenser 4 includes a thermosiphon 4. According to the thermosiphon principle, a fluid, e.g. neon, nitrogen or helium, condenses on the cold head 4 and is transported in liquid form to the unit 2 to be cooled, where it evaporates. The transport can take place by means of gravitation and/or by pumping or pressure differences for instance. During the condensation process, the fluid outputs a quantity of heat, which it reabsorbs upon evaporation. The cooling power is thus transported by way of the liquid fluid from the cold head 3 to the unit 2 to be cooled and is output to the unit 2 to be cooled, whereby this cools down or the unit 2 to be cooled is kept at a constant low temperature of less than the ambient temperature by means of the cooling power.

FIG. 1 only shows a very simplified design of a condenser with a thermosiphon 4, which includes a condenser chamber in thermal contact with the cold head 3, a tubular section and a volume or a chamber in thermal contact with the unit 2 to be cooled, into which the fluid can flow in liquid or gaseous form. Different types of thermosiphon systems are known from the prior art, which can be combined with the present invention. Systems with two parallel, tubular sections can enable an improved, separate transport of liquid and gaseous fluid. The system may be a sealed, closed or open system, which is connected to a refrigeration machine and/or a fluid storage container. Fluid-tight transitions from stationary to rotatable parts within the system are also possible. A heat transport from a rotatable rotor of a machine as a unit 2 to be cooled to a stationary, non-rotating cold source with a connected cold head 3 is possible for instance. In this process, a connection of a rotatable to a stationary part is however associated with increased outlay and reduced heat conductance via the mechanical heat bridge, however this can in principle be applied to these systems. Further embodiments known from the prior art can likewise be combined with the inventive device.

As shown in FIG. 1, a vacuum container 7 can be provided to surround the cold head 3, the condenser with thermosiphon 4, the heat bridge 5 and the unit 2 to be cooled. As a result, a heat exchange from the warm environment with the cold head 3, the condenser with a thermosiphon 4, the heat bridge 5 and the unit 2 to be cooled can be prevented or significantly restricted. Alternatively, the vacuum container 7 can also only be arranged around the unit 2 to be cooled and the volume 6 or can include other areas.

As previously described, a heat transport from the unit 2 to be cooled to the cold head 3 with for instance a connected refrigeration machine takes place in the inventive device 1 by means of the condenser with a thermosiphon 4. A heat transport from the unit 2 to be cooled via the mechanical heat bridge 5 to the cold head 3 takes place at the same time via the heat conductance. The mechanical heat bridge 5 may consist of an effective heat-conductive copper band or pipe, which is mechanically or thermally conducting, with the unit 1 to be cooled on one side and the cold head 3 on the opposite side. A good heat transport between unit 2 to be cooled and cold head 3 via heat conductance can be ensured as a result.

Figure 2:
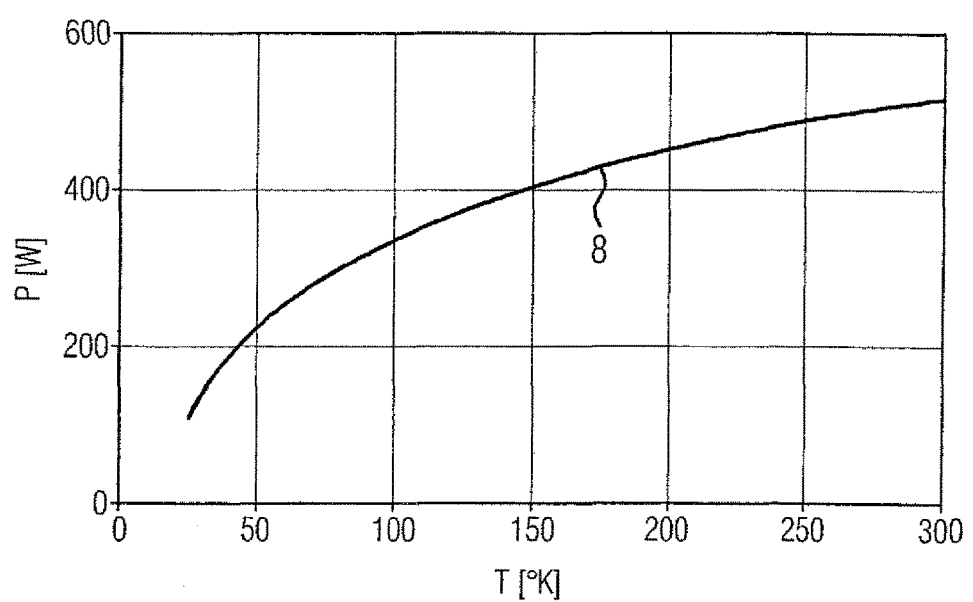

FIG. 2 shows the typical achievable cold head cooling power P in W as a function of the cold head temperature T in ° K for a conventionally used cold head 3. With a dropping temperature T, the achievable cooling power P only reduces slightly and then more significantly. In order to achieve a high degree of efficiency when operating a device 1 for cooling a unit 2, during which the unit 2 must first be cooled down and then kept at the low temperature, it is advantageous if the cold head is able to operate at as high a temperature T as possible. This is achieved if the temperature difference between the unit 2 to be cooled and cold head 3 is kept to a minimum.

Figure 3:
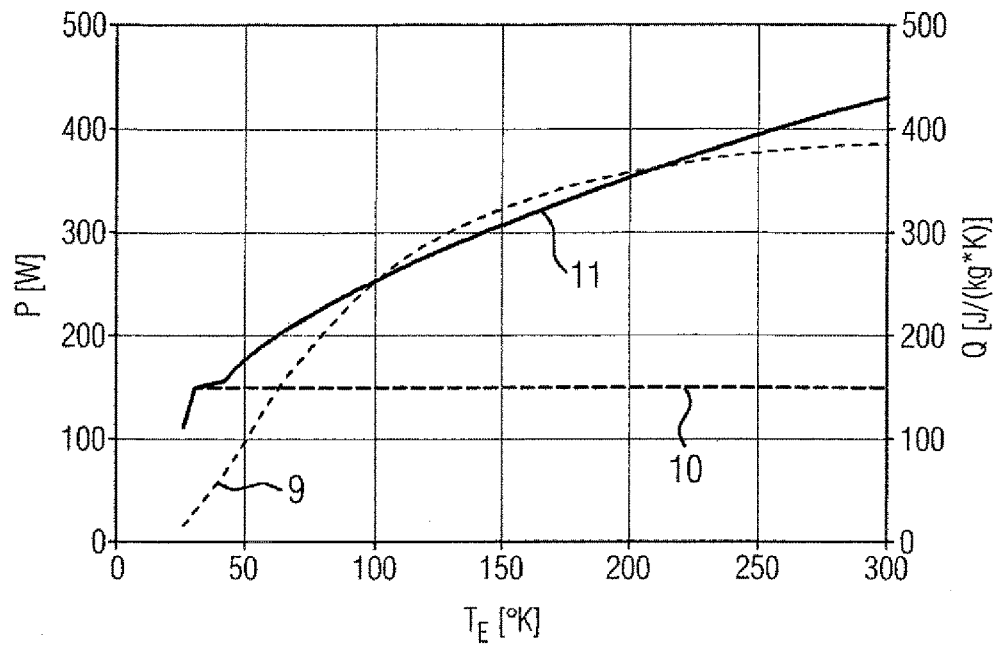

FIG. 3 shows the possible heat transport or the possible cooling power P to be transported with a thermosiphon 4 filled with neon. It is almost constant up to a temperature $T_E$ of approx. 30° K. When using the thermosiphon 4 and heat bridge 5 at the same time, the cold head 3 is kept at a high temperature level by way of the heat transport via the heat bridge 4, said temperature level only lying relatively just below the temperature $T_E$ of the unit 2 to be cooled. Since the thermal capacitance Q 9 of the unit 2 to be cooled at a high temperature $T_E$ is also at a level of about 300° K and then drops significantly from approximately 150° K with a dropping temperature $T_E$, a large part of the quantity of heat to be discharged for the cooling-down process is discharged at a high cold head temperature T, and thus at a large available cooling power P. With simultaneous use of thermosiphon 4 and heat bridge 5, this allows for a transport of cooling power P 11 as a function of the temperature, which almost corresponds to the achievable cooling power P of a typical cold head 3, as shown in FIG. 2. A device with a cold head 3, a condenser with a thermosiphon 4 and at the same time a heat bridge 5 for cooling a unit 2 to be cooled thus operates effectively, i.e. with a high degree of efficiency. Only a little or almost no cooling power P of the cold head 3 is lost due to the inadequate ability to transport to the unit 2 to be cooled.

Figure 4:
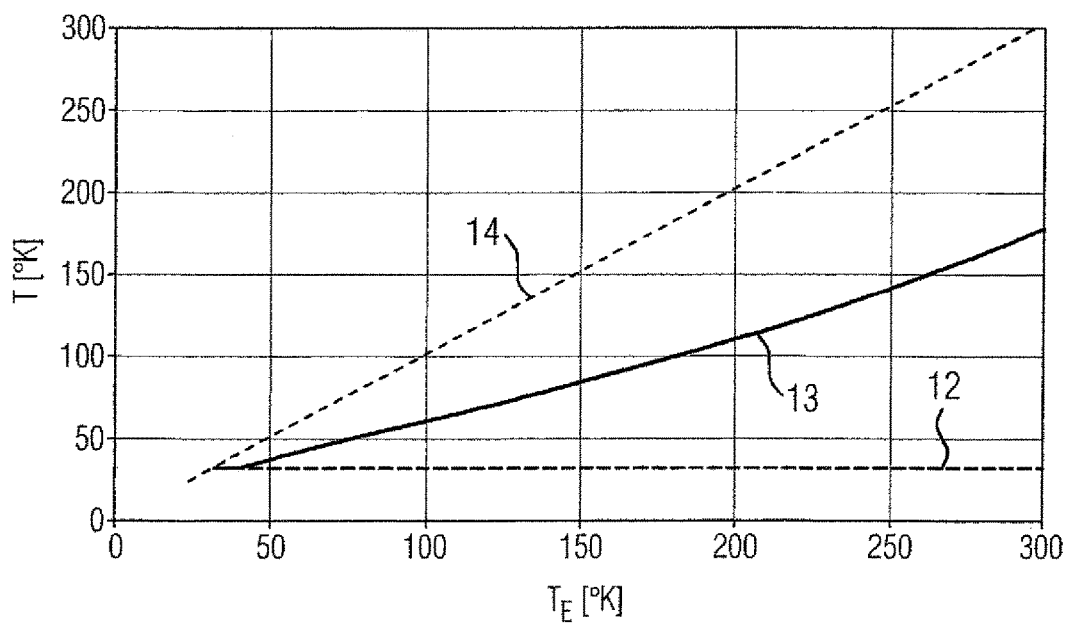

FIG. 4 shows the achievable cold head temperature T 13 in ° K on the unit 2 to be cooled having the device 1 according to the invention. With a cold head 3 in direct contact with the unit 2 to be cooled, without a temperature gradient due to heat transport, the same temperature would prevail on the unit 2 to be cooled as on the cold head 3 during the cool-down process, see curve 14. When only the condenser with a thermosiphon 4 is used, without a mechanical heat bridge 5, only a very slow cooling-down process is possible. The condensation and evaporation of the fluid takes place almost at the same temperature. The operating temperature of the cold head 3 always lies at the boiling temperature of the fluid. During the entire cooling-down period, the cold head 3 lies at a lower temperature T and thus only delivers a minimal cooling power P. As a result, the cooling-down process lasts for a long time.

The temperature T of the cold head 3 is only raised to a high level with the inventive additional use of a heat bridge 5. The cold head 3 can always operate within an optimal temperature range with a high cooling power P even during the cooling-down process. As a result, the unit 2 to be cooled can be cooled down relatively quickly.

Without a thermosiphon 4, a large cross-section of the heat bridge 5 would be necessary in the cooled-down state, in order not to reach large temperature gradients in the unit 2 to be cooled and at the cold head 3. High temperature gradients in the cooled-down state in the unit 2 to be cooled and at the cold head 3 would lead to a poor degree of efficiency. These are therefore to be avoided. The large cross-sections of the heat bridge 5 which are required to be avoided may nevertheless result in impermissibly high mechanical loads of the sensitive cold head 3.

The inventive simultaneous use of a thermosiphon 4 and a heat bridge 5 allow for a rapid cooling down and a high degree of efficiency also to be associated with one another even in the cooled-down state of the unit 2 to be cooled. The heat bridge 5 provides for a rapid cooling-down and in the cooled-down state the thermosiphon principle assumes the cooling of the unit 2 to be cooled. A large cross-section of the heat bridge 5 is not needed, and the previously described disadvantages, associated with a large cross-section, do not occur.

The inventive device 1 can be operated with the inventive method. Previously described exemplary embodiments can be combined with one another and with exemplary embodiments, known from the prior art. Materials such as iron, steel, good heat-conducting plastic or others in conjunction with or instead of copper can be used for instance for the heat bridge 5. The inventive device 1 can also be used for other units 2 to be cooled such as for instance conventional instead of superconducting machines.

The essential inventive idea lies in the thermal connection of a cold head 3 with a unit 2 to be cooled via heat conductance with the aid of a heat bridge 5 and at the same time by means of the thermosiphon principle with the aid of a condenser with thermosiphon 4. The different cooling principles surprisingly do not hamper one another, but instead complement one another, as the diagrams in FIGS. 2 to 4 show. The use of just one cooling principle, such as deemed adequate in the prior art for cooling a unit 2, does not result in cooling with a short cooling-down time and at the same time a good degree of efficiency, even with a further cooling at the temperature to be reached. A short cooling-down time and a good degree of efficiency can also only be achieved with a further cooling process by using the cooling by means of the thermosiphon principle and by the heat conductance with the aid of a heat bridge 5.

What is claimed is:

1. A method, comprising:
cooling a unit via a cold head of a refrigeration machine thermally connected to the unit via a thermosiphon;
conducting heat at a same time via a mechanical heat bridge which provides a direct thermal connection from the cold head to the unit, with the unit to be cooled directly connected to one side of the mechanical heat bridge and the cold head directly connected to the opposite side of the mechanical heat bridge such that the mechanical heat bridge is not directly in contact with the thermosiphon, wherein the mechanical heat bridge has a configuration which is rail-shaped, band-shaped, or a combination thereof and is rigidly connected to the unit, and
using metal for the entire mechanical heat bridge.

2. The method of claim 1, further comprising thermally contacting a condenser with the cold head, condensing gaseous fluid at the condenser, transporting the fluid in liquid form to the unit, and passing the fluid into a gaseous state by absorbing a quantity of heat on or adjacent to the unit.

3. The method of claim 2, wherein the fluid is neon, helium or nitrogen.

4. The method of claim 2, further comprising keeping the cold head at a temperature which is greater than a boiling temperature of the fluid when the unit is cooled down by way of the heat bridge, wherein cooling of the unit takes place essentially by the thermosiphon when the boiling temperature of the fluid is reached.

5. The method of claim 1, wherein the metal is copper.

6. A device for cooling a unit, comprising:
a cold head of a refrigeration machine;
a thermosiphon configured for thermally connecting the cold head to the unit; and
a mechanical heat bridge configured to directly thermally connect the cold head to the unit, with the unit to be cooled directly connected to one side of the mechanical heat bridge and the cold head directly connected to the opposite side of the mechanical heat bridge such that the mechanical heat bridge is not directly in contact with the thermosiphon, wherein the mechanical heat bridge is rail-shaped or band-shaped or both and is rigidly connected to the unit,
wherein the mechanical heat bridge is entirely made of metal.

7. The device of claim 6, further comprising a condenser in thermal contact with the cold head for condensing gaseous fluid on the condenser, said condenser including the thermosiphon for transporting liquid fluid to the unit and transporting the gaseous fluid from the unit to the condenser.

8. The device of claim 6, wherein the fluid is neon, helium or nitrogen.

9. The device of claim 7, wherein the cold head is kept at a temperature which is greater than a boiling temperature of the fluid when the unit is cooled down by the heat bridge, said cold head being essentially at a same temperature as the unit via the thermosiphon when the unit has a temperature which equates to the boiling temperature of the fluid.

10. The device of claim 6, wherein the metal is copper.

11. The device of claim 6, wherein the unit includes a superconductor.

12. The device of claim 11, wherein the superconductor is configured in the form of at least one superconducting coil.

* * * * *